United States Patent [19]
Westwick

[11] Patent Number: 4,785,258
[45] Date of Patent: Nov. 15, 1988

[54] CMOS AMPLIFIER CIRCUIT WHICH MINIMIZES POWER SUPPLY NOISE COUPLED VIA A SUBSTRATE

[75] Inventor: Alan L. Westwick, Austin, Tex.

[73] Assignee: Motorola, Inc., Schaumburg, Ill.

[21] Appl. No.: 97,765

[22] Filed: Sep. 17, 1987

[51] Int. Cl.$^4$ ............................................... H03F 3/45
[52] U.S. Cl. .................................... 330/253; 330/149; 330/260
[58] Field of Search ............... 330/149, 253, 260, 294, 330/307

[56] References Cited

U.S. PATENT DOCUMENTS 4,562,408 12/1985 Nagai et al. ..................... 330/294 X Primary Examiner—James B. Mullins
Attorney, Agent, or Firm—John A. Fisher; Jeffrey Van Myers; Robert L. King

[57] ABSTRACT

A CMOS circuit having a differential input stage which provides a single output is provided. An output stage has a capacitor which is used as a Miller integrator coupled thereto for frequency stabilization. A cascode portion is coupled to the Miller integrator to maintain one of the capacitor's electrodes at a predetermined voltage potential. A compensation portion is coupled to the cascode portion to compensate for power supply induced errors created when either an N-channel transistor in an N-well process or a P-channel transistor in a P-well process is used in the cascode portion.

8 Claims, 1 Drawing Sheet

CMOS AMPLIFIER CIRCUIT WHICH MINIMIZES POWER SUPPLY NOISE COUPLED VIA A SUBSTRATE

TECHNICAL FIELD

This invention relates to electronic amplifiers, and more particularly, to amplifier circuits with frequency stabilization compensation.

BACKGROUND ART

CMOS amplifiers typically utilize a differential input pair of transistors for receiving two input voltages and an output stage which provides a single output as a function of a differential of the two input voltages. Such amplifier circuits typically utilize feedback when utilized with other circuitry. The feedback creates frequency instability which is commonly compensated by a capacitor in the output stage to create a conventional Miller integrator. A cascode transistor is commonly connected to the compensation capacitor for the purpose of maintaining one of the compensation capacitor's electrodes at a fixed voltage potential. Such an amplifier is taught by Wieser et al. in U.S. Pat. No. 4,484,148. The cascode transistor which is coupled to the frequency compensation capacitor may create an error source in the output signal if the cascode transistor has poor power supply voltage rejection. Power supply noise may be coupled thru a cascode transistor to the output if the substrate or bulk of the cascode transistor is connected to the power supply. To prevent this circuit degradation, the cascode transistor must have the bulk of the transistor connected to the source electrode thereof or to another bias voltage that is independent of power supply voltage variations. Therefore the cascode transistor must be either an N-channel transistor built in a P-well process as taught by Wieser et al. or a P-channel transistor built in an N-well process. Circuit designers may be limited to either one process or another. Since P-well processes are more readily available, the use of N-channel cascode devices is common. However, many amplifier configurations require the use of a P-channel cascode transistor. In a conventional P-well process, a P-channel transistor is built directly in the substrate. Therefore, the bulk node of the P-channel transistor is necessarily connected to the positive power supply voltage and is susceptible to the above mentioned problems.

BRIEF DESCRIPTION OF THE INVENTION

Accordingly, an object of the present invention is to provide a CMOS amplifier having improved power supply voltage rejection.

Another object of the present invention is to provide an improved CMOS amplifier circuit which minimizes power supply noise coupled to the circuit via a substrate.

Yet another object of this invention is to improve the number of electronic processes available for optimally implementing a CMOS amplifier with a cascode device.

In carrying out the above and other objects of the present invention, there is provided, in one form, a CMOS amplifier which minimizes power supply noise. A differential input stage comprising first and second transistors receive first and second input voltages, respectively. The differential input stage provides a bias voltage proportional to a differential of the first and second input voltages. An output stage is coupled to the differential input stage and provides an output signal which is proportional to the bias voltage. A frequency stability portion is coupled to the output stage for providing frequency stabilization for the CMOS amplifier. A cascode portion is coupled to the frequency stability portion and maintains a predetermined portion of the frequency stability portion at a predetermined voltage potential. The cascode portion has an error voltage signal component. A compensation portion is coupled to the cascode portion for providing a compensation signal which is proportional to the error voltage signal component. The compensation signal cancels the error voltage signal thereby allowing the predetermined portion of the frequency stability portion to remain at the predetermined voltage potential.

These and other objects, features and advantages will be more clearly understood from the following detailed description taken in conjunction with the accompanying drawings.

DETAILED DESCRIPTION OF THE INVENTION

Figure 1:
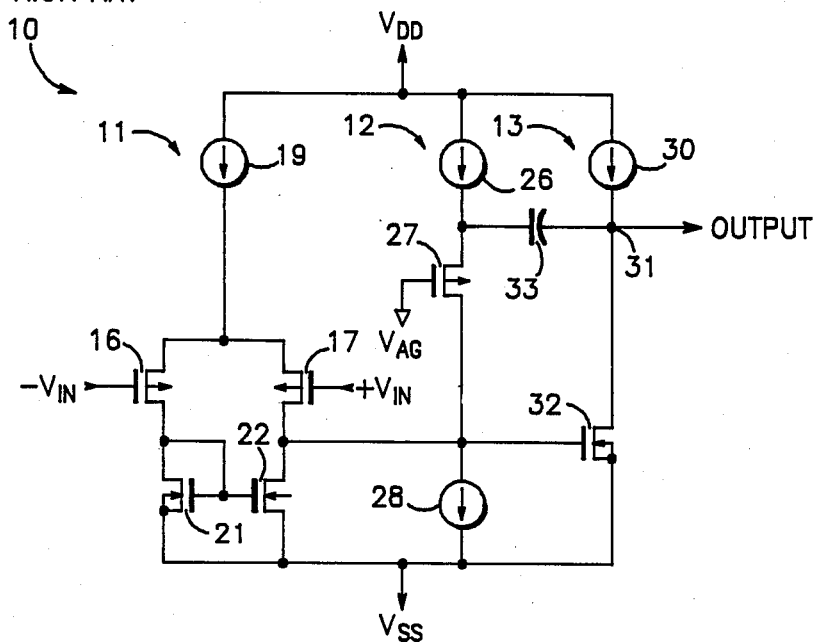
FIG. 1 illustrates in schematic form a drawn differential amplifier utilizing a cascode device.

Shown in FIG. 1 is an amplifier 10 generally comprising a differential portion 11, a cascode portion 12 and an output portion 13. Differential portion 11 comprises a differential pair of P-channel transistors 16 and 17. A current source 19 has a first terminal connected to a power supply voltage terminal for receiving a power supply voltage $V_{DD}$, and has a second terminal connected to a source of both transistors 16 and 17. A gate of transistor 16 is coupled to a negative input voltage labeled $(-V_{IN})$, and a gate of transistor 17 is coupled to a positive input voltage labeled $(+V_{IN})$. A drain of transistor 16 is connected to both a drain and a gate of an N-channel transistor 21. A source of transistor 21 is connected to a power supply voltage terminal for receiving a power supply voltage $V_{SS}$. Power supply voltage $V_{DD}$ is more positive than power supply voltage $V_{SS}$. A drain of transistor 17 is connected to a drain of an N-channel transistor 22. A gate of transistor 22 is connected to the gate of transistor 21. A source of transistor 22 is connected to the power supply voltage terminal which is coupled to power supply voltage $V_{SS}$.

Cascode portion 12 comprises a current source 26 having a first terminal connected to the power supply voltage terminal for receiving the power supply voltage $V_{DD}$. A second terminal of current source 26 is connected to a source of a P-channel transistor 27. A gate of transistor 27 is connected to a reference voltage terminal, labeled analog ground $V_{AG}$. A drain of transistor 27 is connected to a first terminal of a current sink 28 and to the drain of transistor 17. A second terminal of current sink 28 is connected to the power supply voltage terminal for receiving the power supply voltage $V_{SS}$.

Output portion 13 comprises a current source 30 having a first terminal connected to the power supply voltage terminal for receiving the power supply voltage $V_{DD}$. A second terminal of current source 30 is connected to an output terminal 31. An N-channel transistor 32 has a drain connected to output terminal 31, a gate connected to the drain of transistor 17, and a source connected to the power supply voltage terminal for receiving power supply voltage $V_{SS}$. A capacitor 33 has a first electrode connected to output terminal 31, and a second electrode connected to the source of transistor 27.

In operation, differential input voltages $\pm V_{IN}$ are coupled to the gates of input transistors 16 and 17. A single output signal is established by differential portion 11 at the drain of transistor 17. The output signal of differential portion 11 is connected to the gate of transistor 32 of output portion 13. The magnitude of the output signal which is applied to the gate of transistor 32 directly determines the amount of current conducted by transistor 32 and thus determines the magnitude of the output signal at node 31. Current source 30 supplies a fixed amount of current. As the bias voltage of transistor 32 varies, the output voltage at node 31 varies proportionately. Cascode portion 12 functions to maintain the second electrode of capacitor 33 at a predetermined fixed potential, essentially one gate-to-source voltage potential, $V_{GS}$, above the reference voltage $V_{AG}$ so that the A.C. current conducted by capacitor 33 is proportional to the output signal. Assume that amplifier 10 is implemented in a P-well process with a P-channel cascode transistor 27. Cascode transistor 27 is fabricated in the substrate or bulk of the N conductivity substrate. Therefore, transistor 27 is essentially biased by two gate voltages. The first gate bias voltage is VAG, the intended biasing voltage. The second bias voltage is known as the "back" gate voltage coupled from the substrate which is at a potential of $V_{DD}$. Any variations in the $V_{DD}$ voltage potential caused by noise or other factors will cause a modulation in the gate-to-source voltage, $V_{GS}$, of transistor 27. The modulation voltage coupled thru the substrate is a result of poor substrate voltage rejection of cascode transistor 27. A variation in the gate-to-source voltage of transistor 27 creates a variation in the voltage at the second electrode of capacitor 33 and causes capacitor 33 to conduct an A.C. error current. The A.C. error current flows thru cascode transistor 27 to the gate of transistor 32 where the output signal of differential portion 11 is modified.

Figure 2:
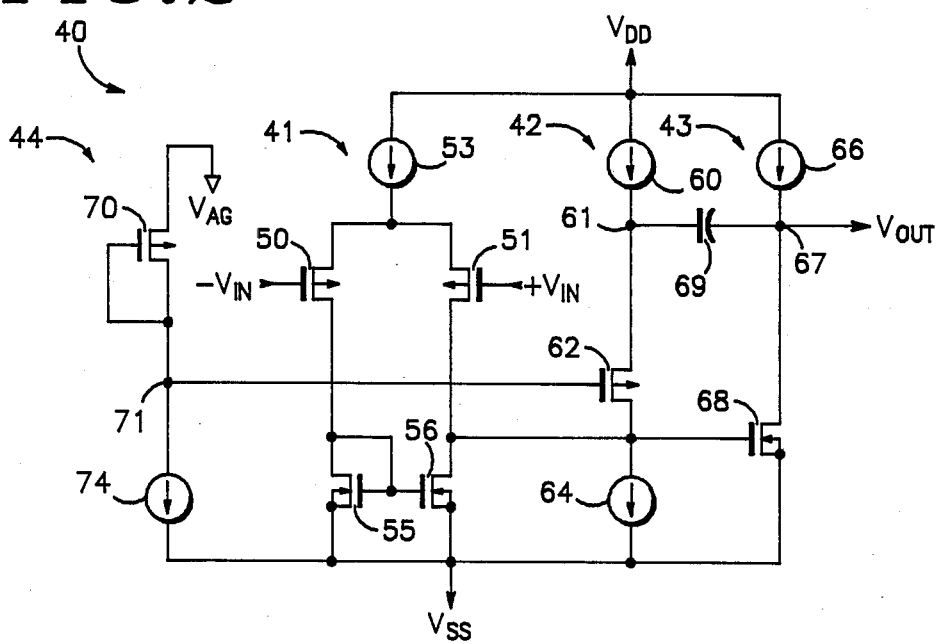
FIG. 2 illustrates in schematic form an improved differential amplifier having a cascode device.

Shown in FIG. 2 is an amplifier 40 which solves the problems associated with amplifier 10 of FIG. 1. Amplifier 40 generally comprises a differential portion 41, a cascode portion 42, an output portion 43 and a biasing portion 44. Differential portion 41 comprises a differential input pair of P-channel transistors 50 and 51. A current source 53 has a first terminal connected to a power supply voltage terminal for receiving a positive power supply voltage $V_{DD}$. A second terminal of current source 53 is connected to a source of each of transistors 50 and 51. A gate of transistor 50 is connected to a negative input voltage labeled $-V_{IN}$. A drain of transistor 50 is connected to both a drain and a gate of a diode-configured N-channel transistor 55. A source of transistor 55 is connected to a power supply voltage terminal for receiving power supply voltage $V_{SS}$. As in FIG. 1, $V_{DD}$ is assumed to have a more positive voltage potential than $V_{SS}$. A gate of transistor 51 is connected to a positive input voltage labeled $+V_{IN}$. A drain of transistor 51 is connected to a drain of an N-channel transistor 56. A gate of transistor 56 is connected to the gate of transistor 55, and a source of transistor 56 is connected to the power supply voltage terminal for receiving power supply voltage $V_{SS}$.

Cascode portion 42 comprises a current source 60 having a first terminal connected to the power supply voltage terminal for receiving power supply voltage $V_{DD}$. A second terminal of current source 60 is connected at a node 61 to a source of a P-channel transistor 62. A gate of transistor 62 is connected to biasing portion 44, and a drain of transistor 62 is connected to a first terminal of a current sink 64. A second terminal of current sink 64 is connected to the power supply voltage terminal which receives power supply voltage $V_{SS}$.

Output portion 43 comprises a current source 66 having a first terminal connected to the power supply voltage terminal which receives power supply voltage $V_{DD}$. A second terminal of current source 66 is connected to an output terminal 67 for providing an output voltage $V_{OUT}$. A drain of an N-channel transistor 68 is connected to the second terminal of current source 66. A gate of transistor 68 is connected to the drain of transistor 51, and a source of transistor 68 is connected to the power supply voltage terminal which receives power supply voltage $V_{SS}$. A frequency stability capacitor 69 is connected between cascode portion 42 and output portion 43. A first electrode of capacitor 69 is connected to output node 67, and a second electrode of capacitor 69 is connected to node 61.

Biasing portion 44 comprises a P-channel transistor 70 having a source connected to a reference voltage terminal for receiving a reference voltage labeled "$V_{AG}$". Reference voltage $V_{AG}$ has a voltage potential which is substantially halfway between the potentials of supply voltages $V_{DD}$ and $V_{SS}$. Transistor 70 is diode configured by having a gate thereof connected to a drain thereof and to a node 71. The gate of transistor 62 is also connected to node 71. A current sink 74 has a first terminal connected to node 71 and has a second terminal connected to the power supply voltage terminal which receives $V_{SS}$.

In operation, differential portion 41 receives positive and negative input voltages and provides a single output at the drain of transistor 51 which is proportional to the magnitude of the differential in voltage between the input voltages. Output portion 43 comprises current source 66 which provides a constant current to output node 67 and transistor 68. Transistor 68 is biased by the single output of differential portion 41. The larger the single output signal is, the more transistor 68 becomes conductive and the smaller the output voltage, $V_{OUT}$, becomes. Capacitor 69 functions as a Miller integrating capacitor which provides frequency compensation. Transistor 62 is a cascode transistor which functions to maintain the second electrode of capacitor 69 at a fixed predetermined voltage. Again, assume that amplifier 40 is fabricated in a P-well process. Instead of biasing the cascode transistor with a fixed reference voltage terminal as was done in amplifier 10, cascode transistor 62 is biased by a voltage which varies exactly the same amount required to cancel any voltage variations coupled to the frequency stability capacitor 69. Biasing portion 44 functions to bias transistor 62 in a manner which maintains the source potential of transistor 62 constant. Transistor 70 is a P-channel transistor similar to P-channel transistor 62 and responds to variations in the power supply voltage $V_{DD}$ which is coupled thru the substrate in the same manner as transistor 62 responds. In particular, as supply voltage $V_{DD}$ varies, the gate-to-source voltage, $V_{GS}$, of transistor 70 varies. Since the voltage potential of the source of transistor 70 is fixed at $V_{AG}$, the $V_{GS}$ variation of transistor 70 occurs at the gate of transistor 70 which is also connected to the drain. Therefore, the voltage potential of the gate of transistor 62 varies by the same amount. For purposes of illustration, if the gate electrode dimensions and current densities of transistors 62 and 70 are substantially equal, the voltage potential of the source of trassistor 62 is also at $V_{AG}$. It should however be understood that transistors 62 and 70 do not have to be physically size ratioed with each other to practice the present invention. As $V_{DD}$ varies, the gate-to-source voltage of transistor 62 varies in a manner to force the source of transistor 62 to remain at the $V_{AG}$ potential. Transistor 62 therefore does not create and allow an error current to be conducted to current sink 64 which would affect the bias voltage of transistor 68. Accordingly, the bias voltage of transistor 68 is comprised of only the true output signal of differential portion 41 and does not create an error component at output node 67.

When an operational amplifier is used with external feedback, an important measure of stability is the ratio of transconductances of transistors 68 and 50 when a large capacitive load is coupled to output node 67. In particular, the following relationship must be satisfied for amplifier 40 to remain stable over a wide frequency range:

$$(G_{m68}/G_{m50})C_{69} > C_L \quad (1)$$

where $G_{m68}$ and $G_{m50}$ are the transconductances of transistors 68 and 50, respectively, $C_{69}$ is the capacitive value of capacitor 69, and $C_L$ is a load capacitance. For purposes of illustration, if a load capacitor has a capacitive value which is significantly larger than the capacitive value of capacitor 69, the transconductance of transistor 68 must be significantly larger than the transconductance of transistor 50. However, because of the difference between electron and hole mobilities, an N-channel transistor has a significantly larger transconductance than a P-channel transistor of equal size. Therefore, an amplifier configuration which is implemented with P-channel transistors in the differential stage and an N-channel transistor in the output stage is more desirable than other conductivity implementations due to frequency and size considerations. The transistor size ratios between N-channel transistors and P-channel transistors must be larger when N-channel transistors are utilized in a differential input stage due to equation one. Such an amplifier implementation results in physically large P-channel transistors. The present invention allows P-channel transistors to be used in a differential stage with a P-well process without any circuit performance degradation occurring from poor power supply voltage rejection. Similarly, should N-channel transistors in a differential stage be used, an N-well process may be implemented without losing any circuit performance from poor power supply voltage rejection.

By now it should be apparent that a CMOS amplifier circuit has been provided which may utilize P-channel transistors in a differential input stage in a P-well process without exhibiting poor high frequency power supply rejection. The present invention allows a wider number of CMOS processes to be utilized without suffering from circuit performance due to problems previously associated with particular processes. As a result of the present invention, inherent advantages associated with particular CMOS processes may be utilized without otherwise suffering from associated disadvantages previously found to be limiting.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

I claim:

1. A CMOS amplifier which minimizes power supply noise, comprising:
    a differential input stage comprising first and second transistors for respectively receiving first and second input voltages and providing a bias voltage proportional to a differential of the first and second input voltage;
    an output stage coupled to the differential input stage for providing an output signal proportional to the bias voltage;
    frequency stability means coupled to the output stage for providing frequency stabilization for the CMOS amplifier;
    cascode means coupled to the frequency stability means, for maintaining a predetermined portion of the frequency stability means at a predetermined voltage potential referenced to a ground potential, said cascode means having an error voltage signal component; and
    compensation means coupled to the cascode means for providing a compensation signal proportional to the error voltage signal component which cancels the error voltage signal, thereby allowing the predetermined portion of the frequency stability means to remain at the predetermined voltage potential.

2. The CMOS amplifier of claim 1 wherein said frequency stability means is a capacitor having a first electrode coupled to the output stage and a second electrode coupled to the cascode means, said second electrode being the predetermined portion of the frequency stability means which is maintained at a predetermined voltage potential.

3. The CMOS amplifier of claim 1 wherein said cascode means further comprise:
    a current source;
    a first transistor of a first conductivity type coupled to the current source, said transistor being fabricated with a substrate of a second conductivity type; and
    a current sink coupled to the transistor.

4. The CMOS amplifier of claim 3 wherein said compensation means further comprise:
    a second transistor of the first conductivity type, said second transistor being diode configured and having a first current electrode coupled to a reference voltage terminal for receiving the predetermined voltage potential, and having a second current electrode coupled to the first transistor for variably biasing the first transistor to maintain the predetermined voltage potential regardless of power supply noise coupled to the predetermined portion of the frequency stability means from the substrate of the first transistor.

5. In an amplifier having a differential input, an output stage with a single output, and a frequency stability capacitor and a cascode transistor, a method of minimzing power supply noise error coupled to the single output thru the cascode transistor, comprising the steps of:
    implementing the cascode transistor as a transistor of a first conductivity type with current electrodes formed in a substrate of a second conductivity type; and coupling compensation means to the cascode transistor for variably biasing the cascode transistor to maintain a predetermined voltage referenced to a ground potential at an electrode of the frequency stability capacitor regardless of variations in power supply voltage.

6. The method of claim 5 further comprising the step of:

implementing the compensation means with a second transistor of the first conductivity type having a first current electrode coupled to the predetermined voltage, and a control electrode connected to a second current electrode in a diode configuration for providing a variable bias voltage to bias the cascode transistor.

7. An amplifier which minimizes power supply voltage errors coupled thru transistors via substrate material of the transistors, comprising:

a differential input stage comprising first and second transistors of a first conductivity type for respectively receiving first and second input voltages and providing a bias voltage proportional to a differential of the first and second input voltages;

a first current source having a first terminal coupled to a first power supply voltage terminal and a second terminal coupled to an output terminal;

a third transistor of a second conductivity type having a first current electrode coupled to the output terminal, a second current electrode coupled to a second power supply voltage terminal, and a control electrode coupled to the bias voltage of the differential input stage;

a second current source having a first terminal coupled to the first power supply voltage terminal, and a second terminal;

a frequency stability capacitor having a first electrode coupled to the output terminal, and a second electrode coupled to the second terminal of the second current source;

a fourth transistor of the first conductivity type having a first current electrode coupled to the second terminal of the second current source, a control electrode, and a second current electrode coupled to the control electrode of the third transistor;

a first current sink having a first terminal coupled to the second current electrode of the fourth transistor, and a second terminal coupled to the second power supply voltage terminal;

a fifth transistor of the first conductivity type having a first current electrode coupled to a reference voltage terminal, a control electrode electrode connected to a second current electrode thereof and coupled to the control electrode of the fourth transistor; and a second current sink having a first terminal coupled to the second current electrode of the fifth transistor, and a second terminal coupled to the second power supply voltage terminal.

8. The amplifier of claim 7 wherein the first conductivity type is a P conductivity and the second conductivity type is an N conductivity.

* * * * *